(12) United States Patent
Kim

(10) Patent No.: US 10,847,588 B2
(45) Date of Patent: Nov. 24, 2020

(54) POLARIZER, DISPLAY DEVICE, AND METHOD OF MANUFACTURING DISPLAY DEVICE

(71) Applicant: LG Display Co., Ltd., Seoul (KR)

(72) Inventor: Jaeho Kim, Gwacheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/844,532

(22) Filed: Dec. 16, 2017

(65) Prior Publication Data

US 2018/0182820 A1 Jun. 28, 2018

(30) Foreign Application Priority Data

Dec. 22, 2016 (KR) .................. 10-2016-0176684

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01); *G09G 3/3233* (2013.01); *G06F 2203/04103* (2013.01); *G06F 2203/04112* (2013.01); *H01L 2227/323* (2013.01)

(58) Field of Classification Search
CPC .......... G02B 1/08; G02B 1/11; G02B 5/3016; G02B 5/3083; G02F 1/133528; G02F 2001/133531; G02F 1/13338; H01L 27/323; H01L 27/3244; H01L 27/3246; H01L 51/0097; H01L 51/5064; H01L 51/508; H01L 51/5092; H01L 51/5281; H01L 2227/323; H01L 27/3232; G06F 3/0412; G06F 3/044; G06F 2203/04103;
(Continued)

(56) References Cited

U.S. PATENT DOCUMENTS 8,217,871 B2 * 7/2012 Lai ..................... G06F 3/0412
345/87
8,330,897 B2 * 12/2012 Seo ..................... G02B 6/0088
349/65
(Continued)

FOREIGN PATENT DOCUMENTS

CN 103885239 A 6/2014
TW 201224634 A 6/2012

OTHER PUBLICATIONS

Office Action dated Nov. 15, 2018 with English translation issued in the corresponding Taiwanese Application No. 106142811, pp. 1-17.

*Primary Examiner* — Michael J Jansen, II
(74) *Attorney, Agent, or Firm* — Polsinelli PC

(57) ABSTRACT

A polarizer, a display device, and a method of manufacturing the display device are disclosed. The display device includes a display panel, a touch screen, a connector, and a polarizer. The display panel has a display area, and the touch screen is positioned on the display panel. The connector protrudes from one side of the touch screen and is connected to an external device. The polarizer is positioned on the touch screen and includes a pattern formed by removing a portion corresponding to the connector so that the portion is recessed inside the polarizer.

10 Claims, 13 Drawing Sheets

(51) Int. Cl.
*G06F 3/044* (2006.01)
*G09G 3/3233* (2016.01)

(58) Field of Classification Search
CPC ......... G06F 2203/04112; G06F 3/0443; G09G 3/3233
See application file for complete search history.

(56) References Cited

U.S. PATENT DOCUMENTS

| | | | | |
|---|---|---|---|---|
| 8,547,505 B2 * | 10/2013 | Oh | .................... | G02F 1/133528 349/96 |
| 8,581,943 B2 * | 11/2013 | Oh | ..................... | G06F 1/1654 345/102 |
| 8,582,065 B1 * | 11/2013 | Enomoto | .......... | G02F 1/133536 349/137 |
| 8,675,155 B2 * | 3/2014 | Hwang | ............. | G02F 1/133528 349/96 |
| 8,692,787 B2 * | 4/2014 | Imazeki | ................. | G06F 3/044 345/173 |
| 8,723,830 B2 * | 5/2014 | Hotelling | ................ | G06F 3/047 345/173 |
| 8,803,815 B2 * | 8/2014 | Wijaya | ................... | G06F 3/041 178/18.01 |
| 9,081,434 B2 * | 7/2015 | Imazeki | .................. | G06F 3/044 |
| 9,143,668 B2 * | 9/2015 | Mathew | ............... | H04N 5/2254 |
| 9,204,536 B2 * | 12/2015 | Yoshiki | ............... | H05K 1/0274 |
| 9,735,185 B1 * | 8/2017 | Evans, V | .............. | G02F 1/1339 |
| 9,881,943 B2 * | 1/2018 | Evans | ................... | G02F 1/1341 |
| 9,997,094 B2 * | 6/2018 | Jung | ........................ | G09G 3/20 |
| 10,038,154 B2 * | 7/2018 | Lee | ..................... | H01L 51/0097 |
| 10,402,019 B2 * | 9/2019 | Jo | ........................... | G06F 3/041 |
| 10,466,822 B2 * | 11/2019 | Kim | ..................... | H04N 5/2257 |
| 10,548,225 B2 * | 1/2020 | Lee | ........................ | H05K 1/118 |
| 10,650,717 B2 * | 5/2020 | Jung | ......................... | G02F 1/133528 |
| 2002/0000979 A1 * | 1/2002 | Furuhashi | .............. | H05K 1/189 345/173 |
| 2007/0103827 A1 * | 5/2007 | Chang | ............... | G02F 1/136204 361/56 |
| 2008/0186430 A1 * | 8/2008 | Seo | .................... | G02F 1/133308 349/65 |
| 2009/0278813 A1 * | 11/2009 | Wijaya | .................... | G06F 3/041 345/173 |
| 2010/0033436 A1 * | 2/2010 | Lai | .......................... | G06F 3/045 345/173 |
| 2010/0149417 A1 * | 6/2010 | Oh | ........................ | G06F 1/1615 348/554 |
| 2011/0227846 A1 * | 9/2011 | Imazeki | .................. | G06F 3/044 345/173 |
| 2012/0105400 A1 * | 5/2012 | Mathew | ................ | G06F 1/1686 345/207 |
| 2012/0154710 A1 * | 6/2012 | Hwang | ............... | G02F 1/13454 349/62 |
| 2013/0002993 A1 * | 1/2013 | Oh | .................... | G02F 1/133528 349/96 |
| 2013/0127781 A1 * | 5/2013 | Hotelling | ................ | G06F 3/044 345/174 |
| 2013/0278873 A1 * | 10/2013 | Enomoto | .......... | G02F 1/133536 349/96 |
| 2014/0176832 A1 * | 6/2014 | Imazeki | .................. | G06F 3/044 349/12 |
| 2015/0075846 A1 * | 3/2015 | Yoshiki | .................... | G06F 3/045 174/253 |
| 2015/0154898 A1 * | 6/2015 | Jung | ........................ | G09G 3/20 345/206 |
| 2016/0062018 A1 * | 3/2016 | Namkung | ......... | G02F 1/133502 257/88 |
| 2017/0123533 A1 * | 5/2017 | Jo | ........................... | G06F 3/041 |
| 2017/0237027 A1 * | 8/2017 | Lee | .................... | H01L 51/0097 257/40 |
| 2017/0358611 A1 * | 12/2017 | Evans, V | .............. | G02F 1/1362 |
| 2017/0358612 A1 * | 12/2017 | Evans, V | ............. | G02F 1/13318 |
| 2018/0063962 A1 * | 3/2018 | Lee | ........................ | G06F 3/0416 |
| 2018/0097022 A1 * | 4/2018 | Evans, V | .............. | G02F 1/1368 |
| 2018/0157362 A1 * | 6/2018 | Kim | ........................ | G06F 3/041 |
| 2018/0182820 A1 * | 6/2018 | Kim | ..................... | H01L 27/323 |
| 2018/0204497 A1 * | 7/2018 | Jung | ........................ | G09G 3/20 |

* cited by examiner

POLARIZER, DISPLAY DEVICE, AND METHOD OF MANUFACTURING DISPLAY DEVICE

CROSS-REFERENCE TO RELATED APPLICATION

This application claims the benefit of Korean Patent Application No. 10-2016-0176684 filed on Dec. 22, 2016, which is incorporated herein by reference for all purposes as if fully set forth herein.

BACKGROUND OF THE DISCLOSURE

Field of the Disclosure

The present disclosure relates to a display device, and more particularly, to a polarizer, a display device, and a method of manufacturing the display device.

Description of the Background

With the development of information technology, the market of display devices used as a connection medium between a user and information is growing. Thus, the use of display devices, such as an electroluminescent display (ELD), a liquid crystal display (LCD), an electrophoretic display (EPD), and a plasma display panel (PDP), is on the rise.

Some of the display devices, for example, the electroluminescent display, the liquid crystal display, and the electrophoretic display have an advantage of thin profile and have been used in a wide range of fields from home appliances such as televisions and video players to portable devices such as notebooks and smart phones.

Some products used in the field of portable devices require a trimming process in manufacturing processes to have a specific shape by reducing a bezel of a display panel. A laser is usually used for the trimming process. However, it should be considered that the trimming process is performed in a state where film layers such as a touch screen and a polarizer are attached to the display panel.

SUMMARY

In one aspect, there is provided a display device comprising a display panel having a display area, a touch screen positioned on the display panel, a connector protruding from one side of the touch screen and connected to an external device, and a polarizer positioned on the touch screen, the polarizer including a pattern formed by removing a portion corresponding to the connector so that the portion is recessed inside the polarizer.

In another aspect, there is provided a method of manufacturing a display device comprising manufacturing a display panel having a display area and a touch screen having a connector, positioning the touch screen on the display panel, defining a trimming line on the display panel and the touch screen, positioning a polarizer exposing the connector on the touch screen, and trimming the trimming line, wherein the polarizer includes a pattern formed by removing a portion corresponding to the connector so that the portion is recessed inside the polarizer.

In yet another aspect, there is provided a polarizer of a quadrilateral shape comprising a pattern formed so that the pattern is recessed inside the polarizer, wherein the pattern includes a first pattern surface having a parallel segment, a second pattern surface having a segment inclined at a first slope with respect to the first pattern surface, and a third pattern surface having a segment inclined at a second slope with respect to the first pattern surface.

In a further aspect, there is provided a display device comprising a display panel having a display area; a connector protruding from the display area and to be connected with an external device; and a polarizer disposed over the display panel and a recessed pattern facing the connector and overlapping the display area, the polarizer having an uppermost portion in line with a trimming line.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to aspects of the present disclosure, examples of which are illustrated in the accompanying drawings. Wherever convenient for explanation of the aspects provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the aspects of the present disclosure.

A display device according to aspects of the disclosure may be implemented as a television, a video player, a personal computer (PC), a home theater system, a smart phone, and the like. However, aspects are not limited thereto. In the following description, a display device according to aspects of the disclosure may be an electroluminescent display implemented based on organic light emitting diodes or inorganic light emitting diodes, by way of example. However, aspects are not limited thereto and may be applied to other types of display devices similar to the electroluminescent display. In the following description, an organic light emitting diode (OLED) display implemented based on organic light emitting diodes is used as an example for convenience of explanation.

Figure 1:
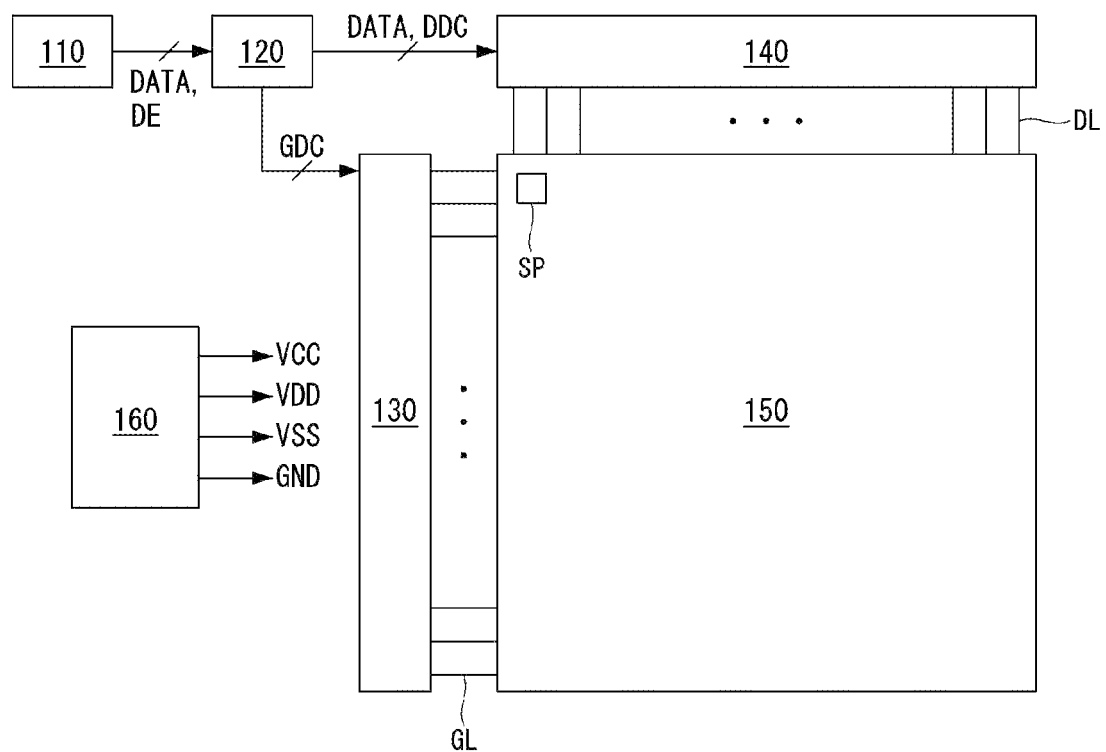
FIG. 1 is a block diagram schematically illustrating a display device according to an aspect of the disclosure.
Figure 2:
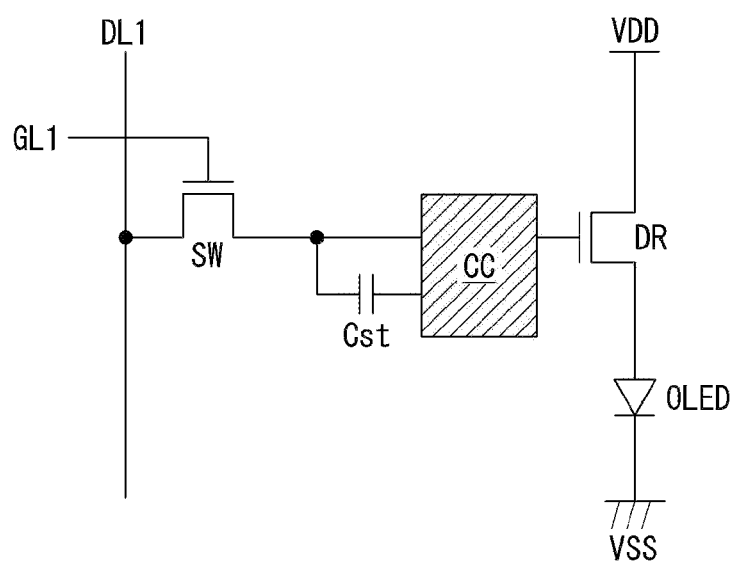
FIG. 2 illustrates an example of a subpixel shown in FIG. 1.

FIG. 1 is a block diagram schematically illustrating a display device according to an aspect of the disclosure. FIG. 2 illustrates an example of a subpixel shown in FIG. 1.

As shown in FIGS. 1 and 2, a display device according to an aspect of the disclosure includes an image processing unit 110, a timing controller 120, a gate driver 130, a data driver 140, a display panel 150, and a power supply unit 160.

The image processing unit 110 performs image processing on an image signal DATA (for example, a data signal DATA) supplied from outside of the display device and supplies it to the timing controller 120. The image processing unit 110 may supply driving signals, such as a data enable signal DE, a vertical sync signal, a horizontal sync signal, and a clock signal, together with the image signal DATA to the timing controller 120.

The timing controller 120 collects extended display identification data (EDID) including a resolution, a frequency, timing information, etc. of the display panel 150 or compensation data from an external memory through I²C interface, etc. The timing controller 120 outputs a gate timing control signal GDC for controlling operation timing of the gate driver 130 and a data timing control signal DDC for controlling operation timing of the data driver 140. The timing controller 120 supplies the data driver 140 with the data signal DATA together with the data timing control signal DDC.

The power supply unit 160 converts electric power supplied from the outside and outputs a voltage through a first high voltage line VCC, a second high voltage line VDD, a first low voltage line GND, and a second low voltage line VSS. A first high voltage, a second high voltage, a first low voltage, and a second low voltage output from the power supply unit 160 are dividedly supplied to the image processing unit 110, the timing controller 120, the gate driver 130, the data driver 140, and the display panel 150.

The data driver 140 samples and latches the data signal DATA in response to the data timing control signal DDC received from the timing controller 120 and converts the digital data signal into an analog data voltage. The data driver 140 then outputs the analog data voltage. The data driver 140 may be implemented as an integrated circuit (IC) and may be mounted on the display panel 150 or on an external substrate connected to the display panel 150. The data driver 140 supplies the data signal DATA to subpixels SP included in the display panel 150 through data lines DL.

The gate driver 130 outputs a gate signal in response to the gate timing control signal GDC received from the timing controller 120. The gate driver 130 may be implemented as an integrated circuit and may be mounted on an external substrate connected to the display panel 150 or formed on the display panel 150 in a gate-in-panel (GIP) manner. The gate driver 130 supplies the gate signal to the subpixels SP included in the display panel 150 through gate lines GL.

The display panel 150 displays an image corresponding to the gate signal received from the data driver 130 and the data voltage received from the scan driver 140. The display panel 150 includes the subpixels SP that display the image through the control of light. Each subpixel SP includes a switching transistor SW, a capacitor Cst, a driving transistor DR, a compensation circuit CC, and an organic light emitting diode (OLED).

The switching transistor SW transfers the data voltage supplied through a data line DL1 to the capacitor Cst in response to the gate signal supplied through a gate line GL1. The capacitor Cst stores the data voltage. The driving transistor DR operates so that a driving current flows between the second high voltage line VDD and the second low voltage line VSS in accordance with the data voltage stored in the capacitor Cst. The organic light emitting diode emits light corresponding to the driving current supplied through the driving transistor DR. The compensation circuit CC compensates for a threshold voltage of the driving transistor DR, and the like. The compensation circuit CC includes one or more transistors and one or more capacitors. The configuration of the compensation circuit CC may be variously changed, and a detailed illustration and description thereof will be omitted.

The subpixel SP is generally configured in a structure of 2T(Transistor)1C(Capacitor) including the switching transistor SW, the capacitor Cst, the driving transistor DR, and the organic light emitting diode. However, when the compensation circuit CC is added, the subpixel SP may be configured in a structure of 3T1C, 4T2C, 5T2C, etc. The subpixel SP having the above-described configuration may be implemented as a top emission subpixel, a bottom emission subpixel, or a dual emission subpixel depending on the structure of the subpixel SP.

The subpixels SP may be implemented with a structure including white subpixels, red subpixels, green subpixels, and blue subpixels, in order to increase light efficiency and prevent a luminance reduction and color degradation of pure colors. In this instance, the white subpixel, the red subpixel, the green subpixel, and the blue subpixel may be implemented using a white organic light emitting diode and red, green, and blue color filters, or may be implemented by a method in which a light emitting material included in the organic light emitting diode is divided into red, green, and blue emitting materials.

Figure 3:
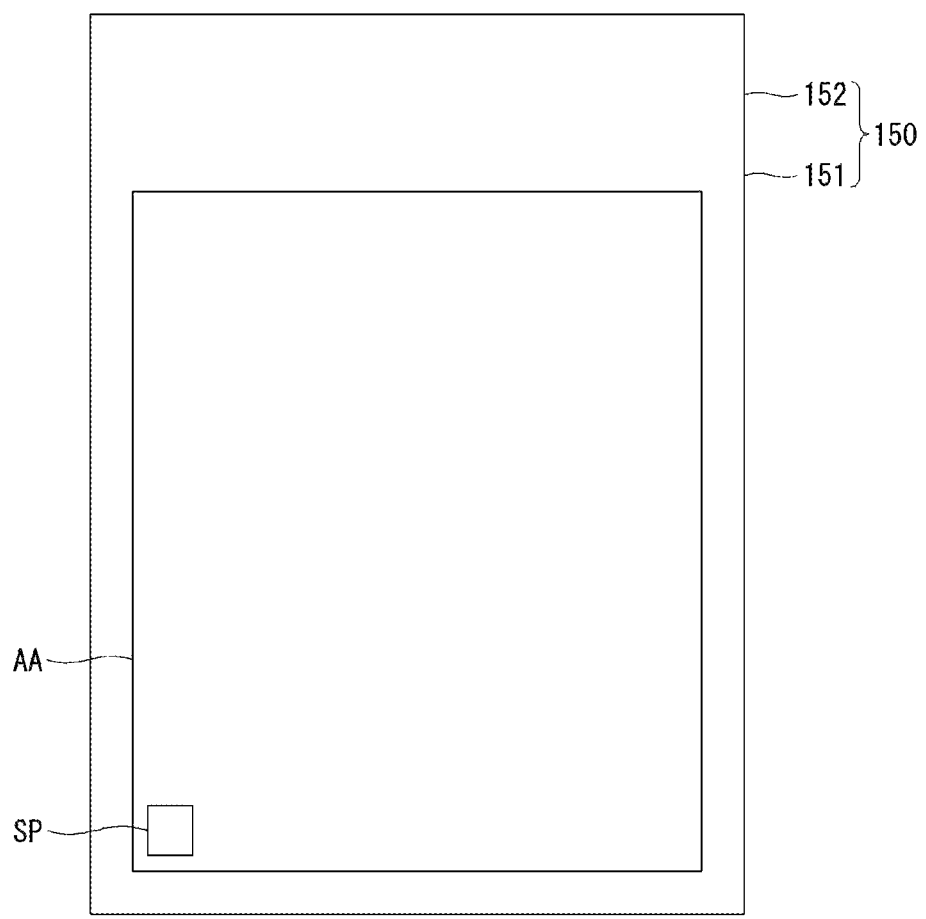
FIG. 3 illustrates a display panel.
Figure 4:
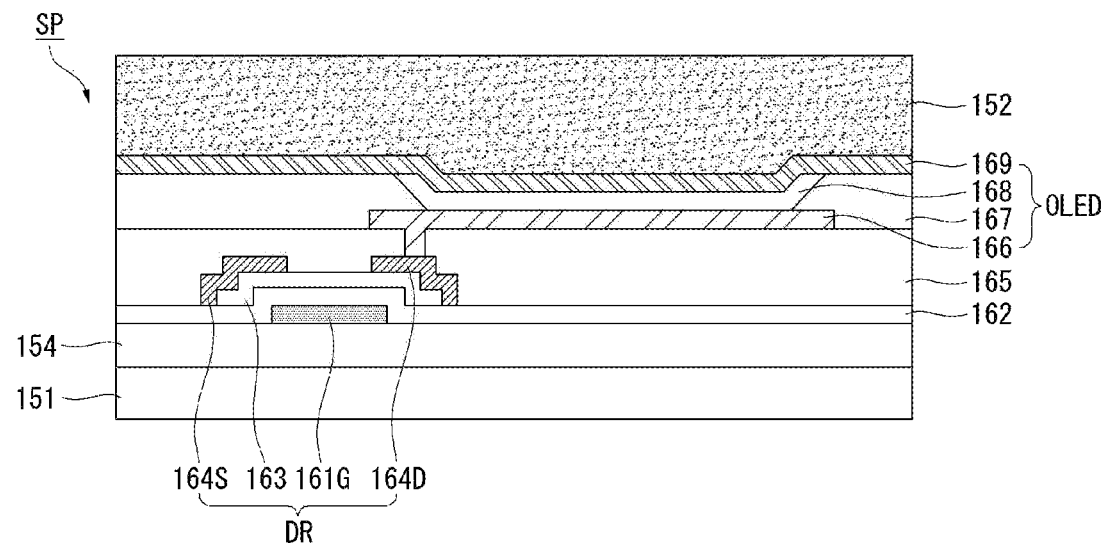
FIG. 4 is a cross-sectional view illustrating an example of a subpixel.
Figure 5:
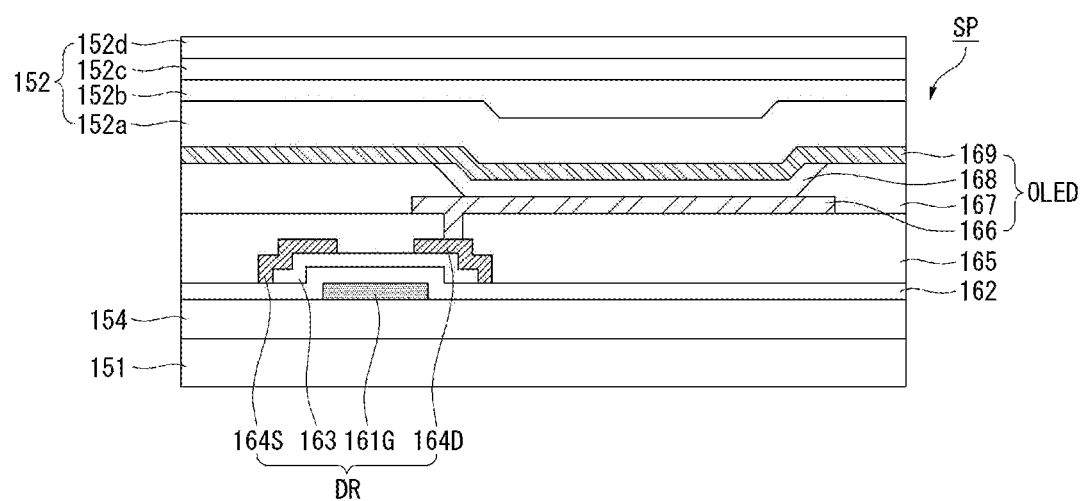
FIG. 5 is a cross-sectional view illustrating another example of a subpixel.

FIG. 3 illustrates the display panel. FIG. 4 is a cross-sectional view illustrating an example of a subpixel. FIG. 5 is a cross-sectional view illustrating another example of a subpixel.

As shown in FIGS. 3 to 5, a display area AA including subpixels SP is formed on one surface of a first substrate 151. The subpixels SP on the first substrate 151 are vulnerable to moisture or oxygen, etc. Thus, the first substrate 151 is sealed by a second substrate 152. The first and second substrates 151 and 152 may be made of glass or a resin such as polyethersulfone (PES), polyethylene terephthalate (PET), polyethylene naphthalate (PEN), polyimide (PI), and polycarbonate (PC). However, aspects are not limited thereto.

The subpixel SP includes various elements. A driving transistor DR and an organic light emitting diode OLED among the various elements will be mainly described below.

The driving transistor DR includes a gate electrode 161G, a semiconductor layer 163, a source electrode 164S, and a drain electrode 164D. The gate electrode 161G is formed on a buffer layer 154. A first insulating layer 162 is formed on the gate electrode 161G. The semiconductor layer 163 is formed on the first insulating layer 162. The source electrode 164S and the drain electrode 164D are disposed to contact one side and the other side of the semiconductor layer 163, respectively. A second insulating layer 165 is formed on the source electrode 164S and the drain electrode 164D. A switching transistor (not shown), a capacitor (not shown), various signal lines, etc. as well as the driving transistor DR are formed on one surface of the first substrate 151.

The organic light emitting diode OLED includes a lower electrode 166, an organic light emitting layer 168, and an upper electrode 169. The lower electrode 166 is formed on the second insulating layer 165. The lower electrode 166 is connected to the drain electrode 164D of the driving transistor DR exposed through the second insulating layer 165. The lower electrode 166 is formed separately for each subpixel. The lower electrode 166 is selected as an anode electrode or a cathode electrode. A bank layer 167 is formed on the lower electrode 166. The bank layer 167 is a layer defining an opening of the subpixel. The organic light emitting layer 168 is formed on the lower electrode 166.

The organic light emitting layer 168 may include a hole injection layer HIL, a hole transport layer HTL, a light emitting layer EML, an electron transport layer ETL, and an electron injection layer EIL. At least one of the remaining function layers HIL, HTL, ETL, and EIL except the light emitting layer EML of the organic light emitting layer 168 may be omitted. The organic light emitting layer 168 may further include a blocking layer or a barrier layer for controlling energy levels, etc. of holes and electrons. The upper electrode 169 is formed on the organic light emitting layer 168. The upper electrode 169 may be formed as an opposing electrode commonly connected to all the subpixels SP. The upper electrode 169 is selected as the cathode electrode or the anode electrode.

The second substrate 152 is formed on the upper electrode 169. The second substrate 152 may be formed in the form of a substrate or a film. Assuming that the second substrate 152 is formed in the form of the film, the second substrate 152 may be formed in the form of a single layer film as shown in FIG. 4. In this instance, the second substrate 152 may be formed of a transparent face sealant or a transparent film.

On the contrary, the second substrate 152 may be formed in the form of a multilayer film as shown in FIG. 5. In this instance, the second substrate 152 may be formed of an organic inorganic combination layer including an organic layer 152a, an inorganic layer 152b, an organic layer 152c, and an inorganic layer 152d. Although not shown, the organic inorganic combination layer may further include an absorption layer absorbing moisture or oxygen.

The display device described above may be used in the field of portable devices. Partial configuration of the display device used in the field of portable devices related to the display panel is briefly described below.

Figure 6:
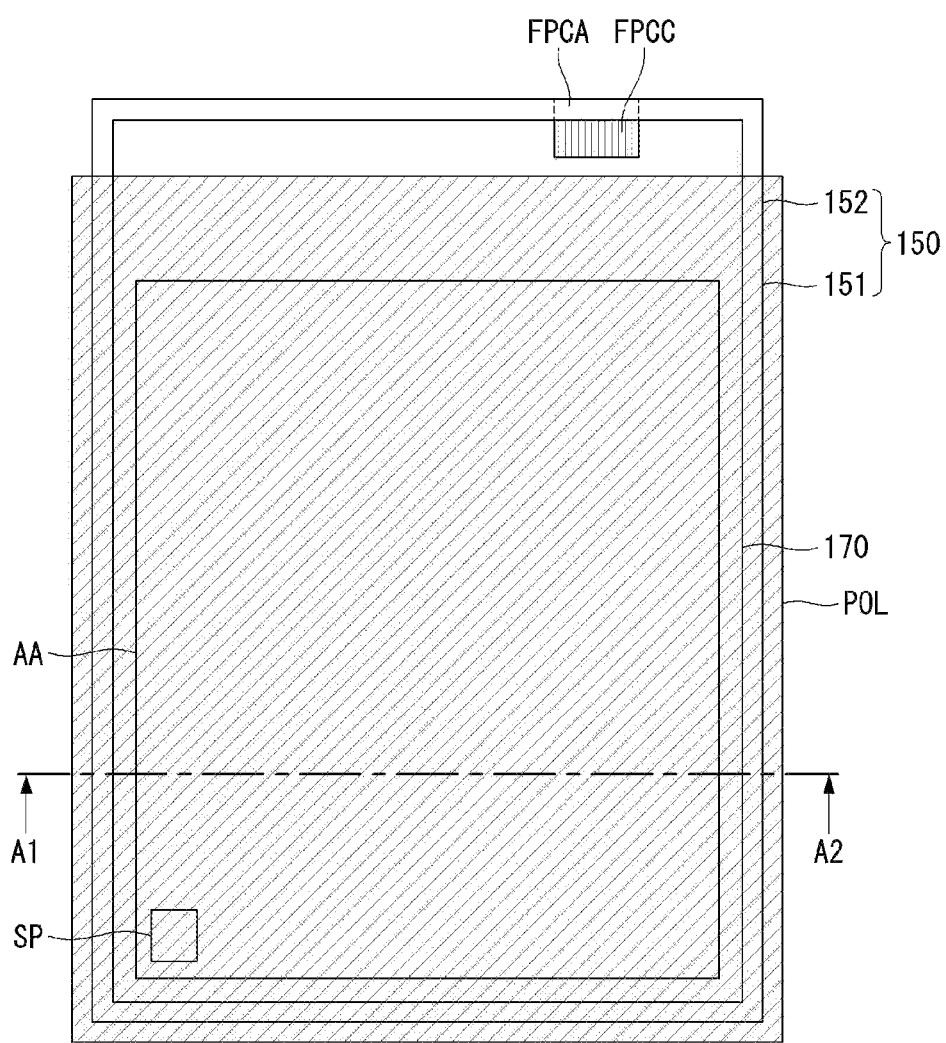
FIGS. 6 and 7 are a front view and a cross-sectional view of a display device used in portable devices.
Figure 7:
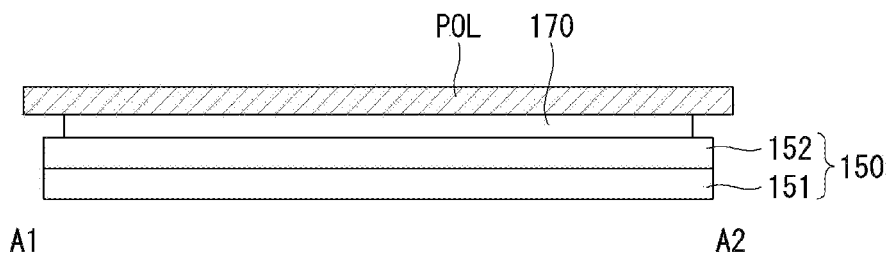

FIGS. 6 and 7 are a front view and a cross-sectional view of a display device used in the field of portable devices.

As shown in FIGS. 6 and 7, the display device used in the field of portable devices further includes a touch screen 170 and a polarizer POL that are disposed on the display panel 150. FIGS. 6 and 7 illustrate that the touch screen 170 and the polarizer POL are attached to the display panel 150 in the order named, by way of example. However, aspects are not limited thereto. For example, the polarizer POL and the touch screen 170 may be attached to the display panel 150 in the order named.

The touch screen 170 may be implemented as a capacitive touch screen that senses a touch input through a plurality of capacitive sensors. The touch screen 170 includes a plurality of touch sensors each having a capacitance. The capacitance may be divided into a self-capacitance and a mutual capacitance. The self-capacitance may be formed along a conductor line of a single layer formed in one direction, and the mutual capacitance may be formed between two conductor lines perpendicular to each other.

The touch screen 170 receives a touch driving signal from a touch driver positioned outside the display device. A connector FPCC for the electrical connection between the touch driver and the touch screen 170 is disposed on one side of the touch screen 170. The connector FPCC is connected to the touch driver by a flexible cable or the like and may be referred to as a pad having a plurality of metal electrodes.

The polarizer POL prevents light, which is incident from the outside and enters the inside of the display panel 150, from being reflected and coming out. The polarizer POL prevents reflection of incident light, thereby preventing a reduction in outdoor visibility of the display panel 150. The polarizer POL may be selected as a circular polarizer having a linear polarizing film and a retardation film, but is not limited thereto.

Some products used in the field of portable devices require a trimming process for manufacturing them to a specific shape (for example, a shape in which a connector protrudes) by reducing bezels of the display panel 150 and the touch screen 170. A laser is usually used for the trimming process. However, the trimming process is performed in a state where film layers such as the touch screen 170 and the polarizer POL are attached to the display panel 150.

The trimming process includes a step of manufacturing the display panel 150 having the display area and the touch screen 170 including the connector FPCC, a step of disposing the touch screen 170 on the display panel 150, a step of defining a trimming line TL on the display panel 150 and the touch screen 170, a step of disposing the polarizer POL exposing the connector FPCC on the touch screen 170, and a step of trimming the trimming line TL.

As briefly described above, the polarizer POL has optical characteristic that prevents light incident from the outside from coming out. Thus, when the trimming process using the laser is performed, the optical characteristic of the polarizer POL has to be considered. This is because equipment used in the trimming process has to recognize a trimming position, etc. using a device such as a camera or a sensor. Namely, the polarizer POL having the optical characteristic to block light may be an obstacle that interferes with a normal operation of such a device.

However, when the trimming process is performed without considering the optical characteristic of the polarizer POL considering only the bezel area, an error may occur in the device such as the camera or the sensor. Hence, trimming equipment may move out of a trimming position or may not proceed with the trimming process.

A portion of the display panel 150 where the optical characteristic of the polarizer POL has to be most considered is an area in which the connector FPCC is formed. More specifically, because the formation area of the connector FPCC is divided into a formation portion of the polarizer POL and a non-formation portion of the polarizer POL, most errors occur in the formation area of the connector FPCC when the trimming process is performed.

Hereinafter, problems of a display device and a trimming process thereof according to experimental examples will be described as follows.

Experimental Example

Figure 8:
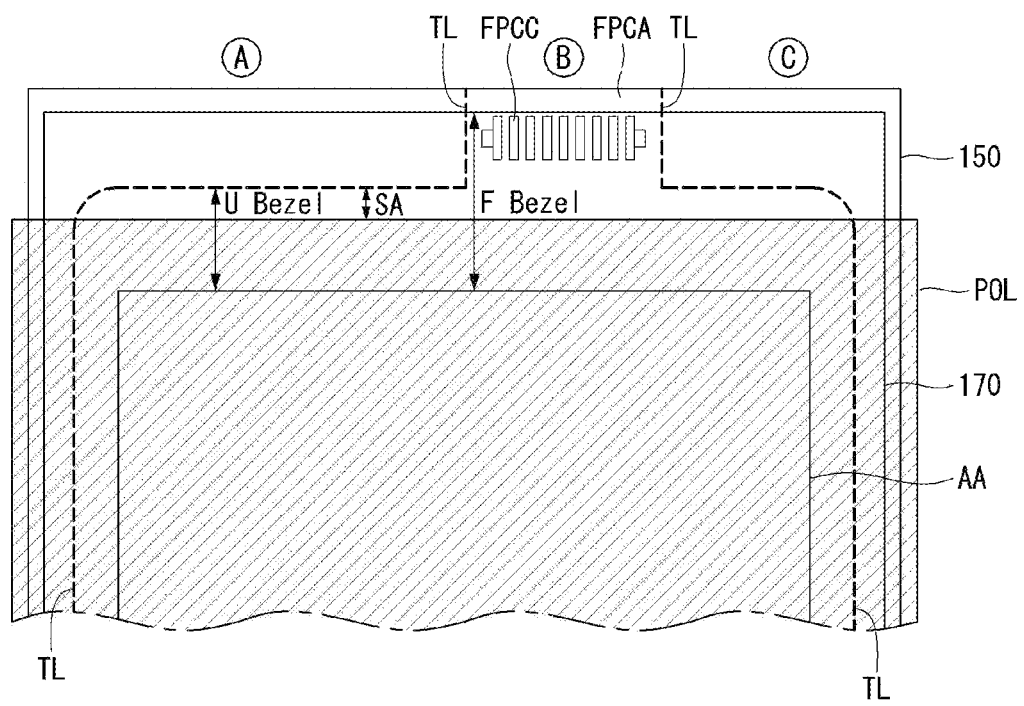
FIG. 8 illustrates a method for trimming a display panel according to an experimental example.
Figure 9:
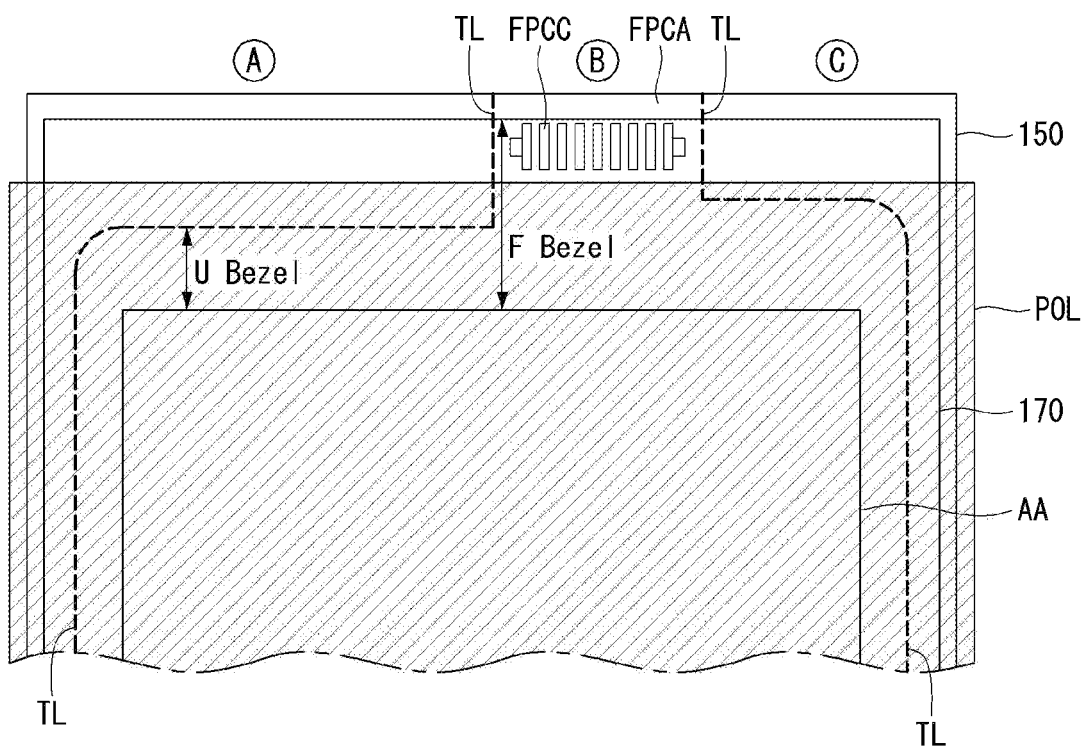
FIG. 9 illustrates a method for trimming a display panel according to another experimental example.

FIG. 8 illustrates a method for trimming a display panel according to an experimental example. FIG. 9 illustrates a method for trimming a display panel according to another experimental example.

As shown in FIGS. 8 and 9, a trimming line TL is defined to surround a periphery of a connector FPCC of a touch screen 170 and a periphery of a display area AA of a display panel 150 from the bottom of the connector FPCC. The trimming line TL has a round shape at a portion corresponding to each edge of the display area AA. The trimming line TL has a straight line shape at a portion corresponding to the periphery of the connector FPCC.

A trimming process using a laser may start from a left trimming line TL (a portion adjacent to "A" in FIGS. 8 and 9) of the connector FPCC, proceed along the periphery of the display area AA, and end at a right trimming line TL (a portion adjacent to "C" in FIGS. 8 and 9) of the connector FPCC. The left trimming line TL and the right trimming line TL may be positioned on the same line, or one of the left trimming line TL and the right trimming line TL may be closer to the display area AA than the other. However, aspects are not limited thereto.

A polarizer POL having a quadrilateral or rectangular shape is attached to the touch screen 170. The polarizer POL covers both the display area AA and a non-display area around the display area AA. The polarizer POL exposes a connection area FPCA where the connector FPCC exists and a periphery of the connector FPCC. The display panel 150 and the touch screen 170 have almost the same size.

However, the polarizer POL is provided smaller than the display panel 150 and the touch screen 170, in order to expose the connection area FPCA in which the connector FPCC is formed and the periphery of the connector FPCC. As a result, an upper end of the polarizer POL exists between the display area AA and the connector FPCC.

A reason why the polarizer POL is positioned and attached as described above is that an anisotropic conductive film (ACF) is formed in the connector FPCC connected to an external device and reacts to a head capable of applying heat compression. Therefore, the connection area FPCA of the connector FPCC and the periphery of the connector FPCC have to consider this.

When the polarizer POL is positioned adjacent to the connector FPCC, the polarizer POL may be damaged (for example, wrinkled or contracted) by heat. Thus, the polarizer POL is provided smaller than the display panel 150 and the touch screen 170, in order to prevent the heat damage.

The following experimental examples are described on the assumption that the left side "A" occupies a larger area than the right side "C" on the basis of the connector FPCC (i.e., on the basis of a portion "B"). However, the assumption is merely an example, and aspects are not limited thereto.

An Experimental Example

According to an experimental example illustrated in FIG. 8, the upper end of the polarizer POL is disposed to be spaced apart from the trimming line TL in consideration of the optical characteristics of the polarizer POL and a tolerance of the trimming line TL. However, in the experimental example, a separation distance SA exists between the trimming line TL and the upper end of the polarizer POL due to the tolerance design. Hence, a distance (or referred to as "U-shaped bezel") between the trimming line TL and an upper end of the display area AA and a distance (or referred to as "F-shaped bezel") between an outer end of the connector FPCC and the upper end of the display area AA increase.

Another Experimental Example

According to another experimental example illustrated in FIG. 9, the trimming line TL and the upper end of the polarizer POL overlap each other in consideration of the optical characteristics of the polarizer POL and a tolerance of the trimming line TL. However, in the second experimental example, a distance (or referred to as "F-shaped bezel") between an outer end of the connector FPCC and an upper end of the display area AA increases due to the overlap design.

Hereinafter, a display device and a trimming process thereof according to aspects of the disclosure capable of solving the problems of the display device and the trimming process thereof according to the experimental examples will be described as follows. A trimming line according to a first aspect of the disclosure has the same condition as the experimental examples, and thus a description thereof may be briefly made or may be entirely omitted.

First Aspect

Figure 10:
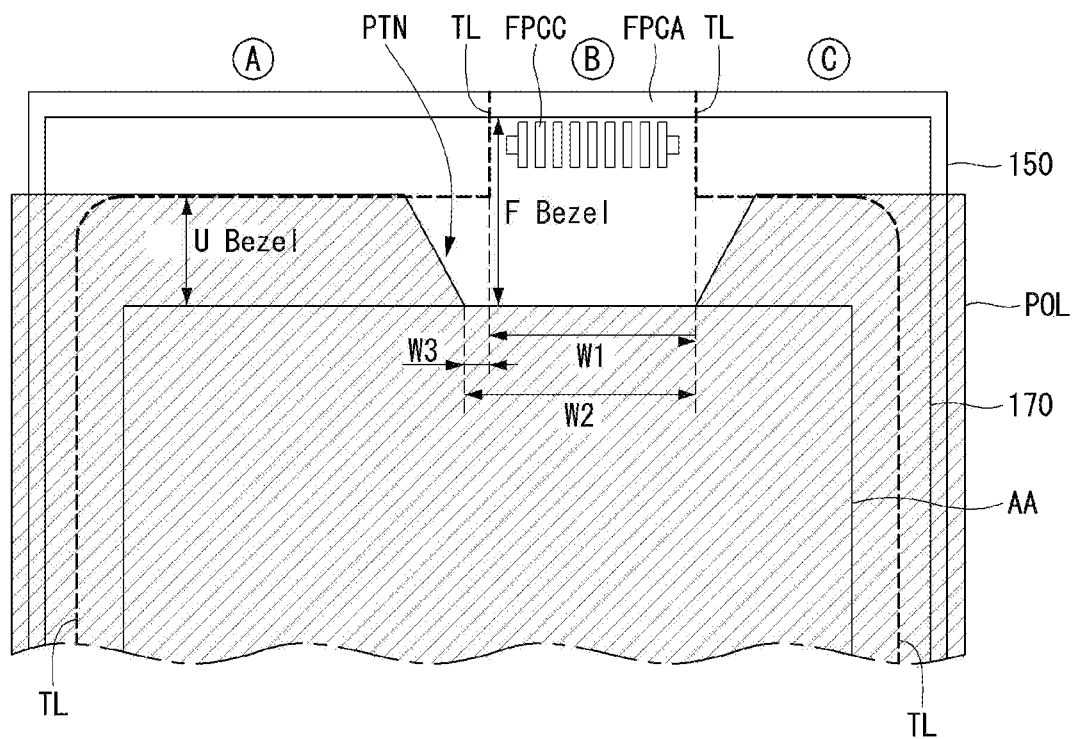
FIG. 10 illustrates a method for trimming a display panel according to a first aspect of the disclosure.
Figure 11:
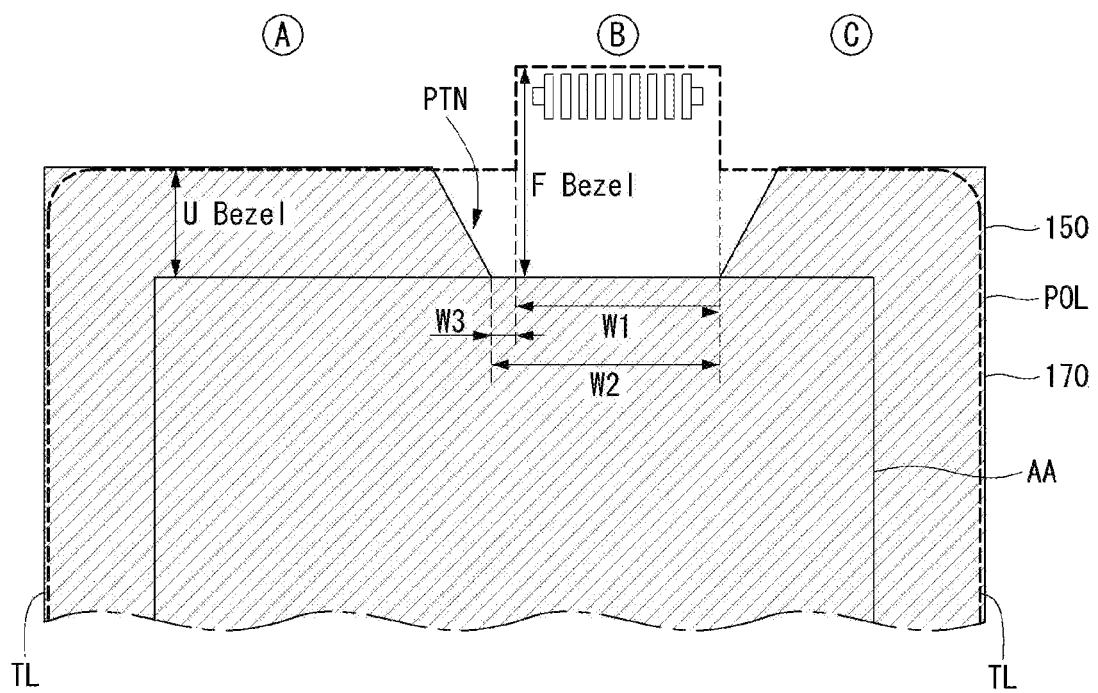
FIG. 11 illustrates a display panel after a trimming process is performed.
Figure 12A:
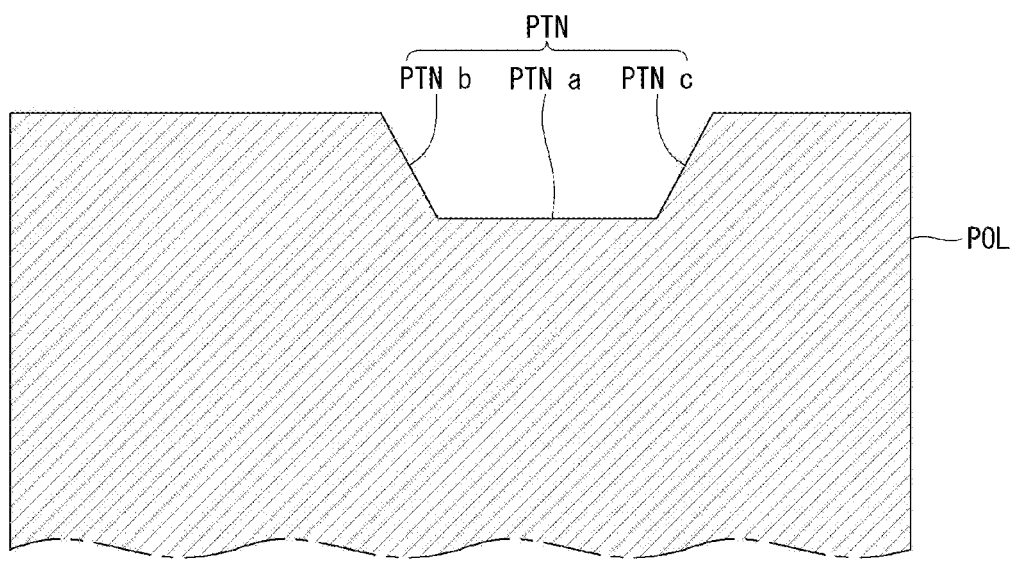
FIGS. 12A and 12B illustrate a structure of a polarizer according to an aspect of the disclosure.
Figure 12B:
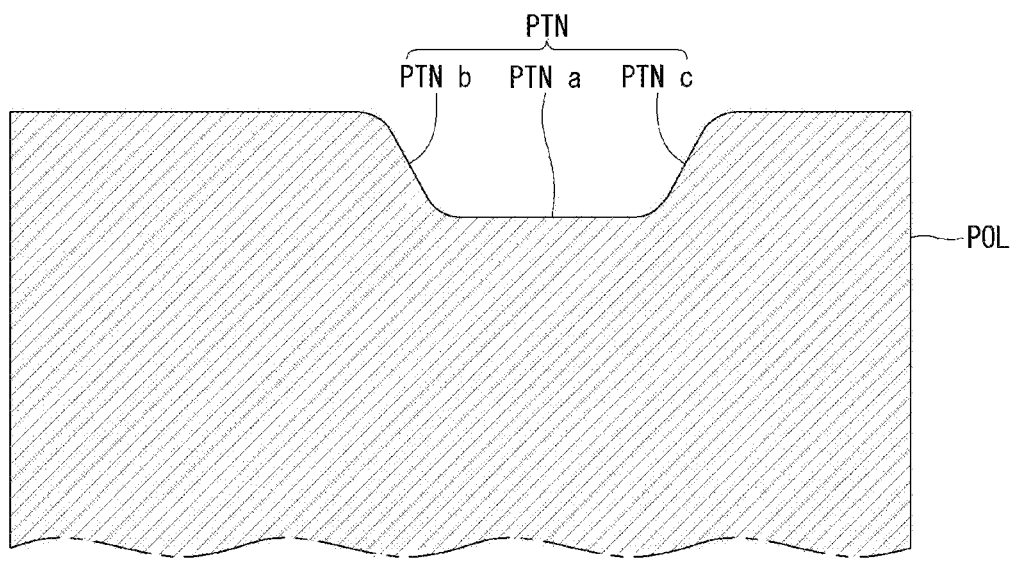

FIG. 10 illustrates a method for trimming a display panel according to a first aspect of the disclosure. FIG. 11 illustrates a display panel after a trimming process is performed. FIGS. 12A and 12B illustrate a structure of a polarizer according to the first aspect of the disclosure.

As shown in FIGS. 10 and 11, a polarizer POL is attached to a touch screen 170 and covers a display area AA and a non-display area around the display area AA. The polarizer POL exposes a connection area FPCA where a connector FPCC exists and a periphery of the connector FPCC. A display panel 150 and the touch screen 170 have almost the same size.

However, the polarizer POL is provided smaller than the display panel 150 and the touch screen 170, in order to expose the connection area FPCA in which the connector FPCC is formed and the periphery of the connector FPCC. As a result, an upper end of the polarizer POL exists between the display area AA and the connector FPCC.

The first aspect of the disclosure uses the polarizer POL of a quadrilateral or rectangular shape having a pattern PTN formed by cutting a portion of the polarizer POL corresponding to the connector FPCC (or the periphery of the connector FPCC). The pattern PTN is configured such that a portion adjacent to the connector FPCC is removed more than a portion adjacent to the display area AA. For example, the pattern PTN has a rectangular shape, a trapezoidal shape, or a polygonal shape by cutting a portion of the polarizer POL corresponding to the connector FPCC, so that the portion of the polarizer POL corresponding to the connector FPCC is recessed inside the polarizer POL. Namely, the first aspect of the disclosure uses the free form polarizer POL. The following description uses an example where the pattern PTN has the trapezoidal shape.

Because the polarizer POL according to the first aspect of the disclosure includes the pattern PTN recessed inside the polarizer POL, an upper end of the polarizer POL can coincide with a trimming line TL without considering the heat applied to the connector FPCC. Namely, the first aspect of the disclosure does not provide a separation distance between the trimming line TL and the upper end of the polarizer POL.

As a result, a distance (or referred to as "U-shaped bezel") between the trimming line TL and the upper end of the display area AA and a distance (or referred to as "F-shaped bezel") between an outer end of the connector FPCC and the upper end of the display area AA can decrease. Namely, even when the upper end of the polarizer POL coincides with the trimming line TL in the first aspect of the disclosure, both the U-shaped bezel and the F-shaped bezel do not increase compared to the experimental examples.

Because the first aspect of the disclosure attaches the free form polarizer POL to the touch screen 170 and then performs a trimming process, the first aspect of the disclosure can perform the trimming process without increasing a distance related to the bezel and without being affected by the optical characteristics of the polarizer POL.

An inner width W2 of the pattern PTN may be greater than a width W1 occupied by the connector FPCC in consideration of an adhesive margin of the polarizer POL and heat applied to the connector FPCC. For example, because the pattern PTN has a margin width W3 so that a portion corresponding to a left trimming line TL (a portion adjacent to "A" in FIGS. 10 and 11) of the connector FPCC is wider the connector FPCC, the inner width W2 of the pattern PTN may be greater than the width W1 occupied by the connector FPCC. Alternatively, the inner width W2 of the pattern PTN may be greater than the width W1 occupied by the connector FPCC through a margin width for a portion corresponding to a right trimming line TL (a portion adjacent to "C" in FIGS. 10 and 11) of the connector FPCC.

As shown in FIG. 11, the display panel 150 and the touch screen 170 are trimmed so that a formation portion of the connector FPCC protrudes in a quadrilateral shape. Because the aspect of the disclosure uses an example where the connector FPCC is positioned at an upper end of the display panel 150, the formation portion of the connector FPCC has the quadrilateral protruding shape. However, the aspect of the disclosure is not limited thereto and can be applied to other free form display panels.

As shown in FIGS. 12A and 12B, the pattern PTN has a first pattern surface PTNa having a segment parallel to the upper end of the polarizer POL, a second pattern surface PTNb having a segment inclined at a first slope with respect to the first pattern surface PTNa, and a third pattern surface PTNc having a segment inclined at a second slope with respect to the first pattern surface PTNa. The first slope and the second slope may be equal to or different from each other.

An inner width of the pattern PTN corresponds to a length of the first pattern surface PTNa, and an outer width of the pattern PTN corresponds to a separation distance between the second pattern surface PTNb and the third pattern surface PTNc. As shown in FIGS. 12A and 12B, edges (for example, four edges of the trapezoidal pattern PTN) of the pattern PTN may be straight or curved.

Hereinafter, other aspects of the polarizer POL used in the trimming process so that the connector FPCC protrudes from the upper end of the display panel 150 are described.

Second Aspect

Figure 13A:
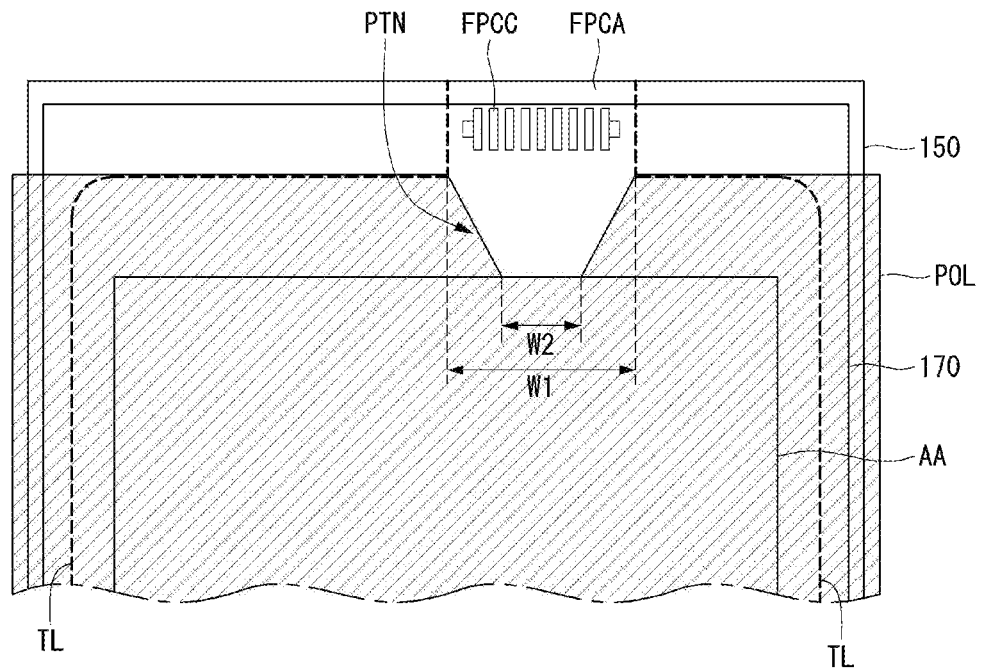
FIGS. 13A and 13B illustrate a method for trimming a display panel according to a second aspect of the disclosure.
Figure 13B:
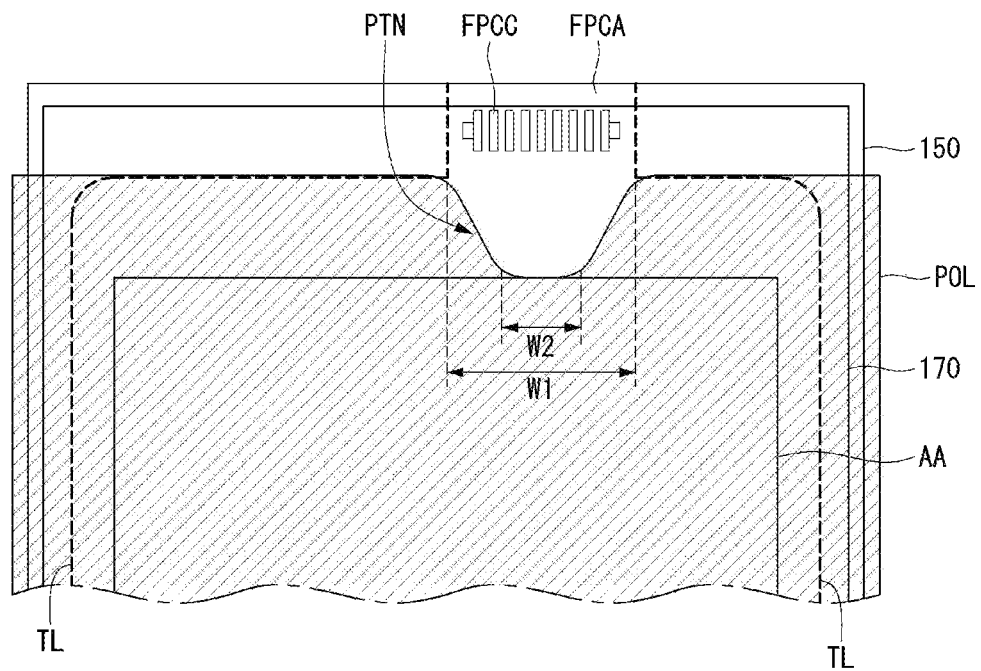

FIGS. 13A and 13B illustrates a method for trimming a display panel according to a second aspect of the disclosure.

As shown in FIGS. 13A and 13B, a polarizer POL is attached to a touch screen 170 and covers a display area AA and a non-display area around the display area AA. The polarizer POL exposes a connection area FPCA where a connector FPCC exists and a periphery of the connector FPCC. A display panel 150 and the touch screen 170 have almost the same size.

However, the polarizer POL is provided smaller than the display panel 150 and the touch screen 170, in order to expose the connection area FPCA in which the connector FPCC is formed and the periphery of the connector FPCC.

As a result, an upper end of the polarizer POL exists between the display area AA and the connector FPCC.

The second aspect of the disclosure uses the polarizer POL of a quadrilateral or rectangular shape having a pattern PTN formed by cutting a portion of the polarizer POL corresponding to the connector FPCC (or the periphery of the connector FPCC). The pattern PTN is configured such that a portion adjacent to the connector FPCC is removed more than a portion adjacent to the display area AA. For example, the pattern PTN has a trapezoidal shape by cutting a portion corresponding to the connector FPCC, so that the portion corresponding to the connector FPCC is recessed inside the polarizer POL. Namely, the second aspect of the disclosure uses the free form polarizer POL.

Because the polarizer POL according to the second aspect of the disclosure includes the pattern PTN recessed inside the polarizer POL, an upper end of the polarizer POL can coincide with a trimming line TL without considering heat applied to the connector FPCC. Namely, the second aspect of the disclosure does not provide a separation distance between the trimming line TL and the upper end of the polarizer POL.

As a result, a distance (or referred to as "U-shaped bezel") between the trimming line TL and the upper end of the display area AA and a distance (or referred to as "F-shaped bezel") between an outer end of the connector FPCC and the upper end of the display area AA can decrease. Namely, even when the upper end of the polarizer POL coincides with the trimming line TL in the second aspect of the disclosure, both the U-shaped bezel and the F-shaped bezel do not increase compared to the experimental examples.

Because the second aspect of the disclosure attaches the free form polarizer POL to the touch screen 170 and then performs a trimming process, the second aspect of the disclosure can perform the trimming process without increasing a distance related to the bezel and without being affected by the optical characteristics of the polarizer POL.

An outer width of the pattern PTN and a width W1 occupied by the connector FPCC may be the same as each other without considering an adhesive margin of the polarizer POL. In this instance, an inner width W2 of the pattern PTN may be less than the width W1 occupied by the connector FPCC. Even when the inner width W2 of the pattern PTN is less than the width W1 occupied by the connector FPCC, the outer width of the pattern PTN is the same as the width W1 occupied by the connector FPCC, and a separation space exists inside the pattern PTN. Thus, an influence of heat applied to the connector FPCC is small. Further, as shown in FIGS. 13A and 13B, edges of the pattern PTN may be straight or curved.

Third Aspect

Figure 14A:
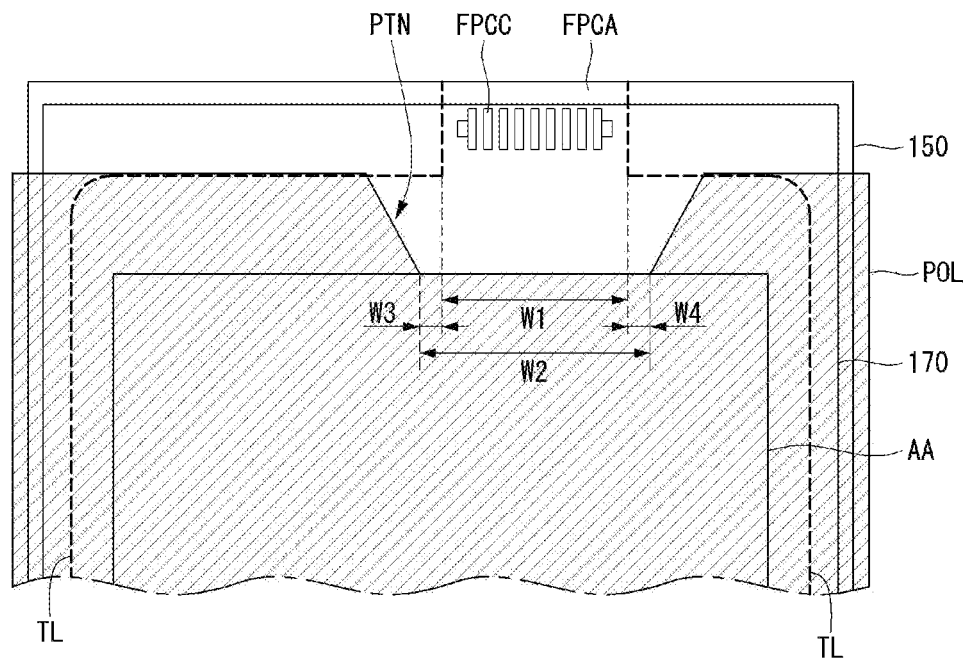
FIGS. 14A and 14B illustrates a method for trimming a display panel according to a third aspect of the disclosure.
Figure 14B:
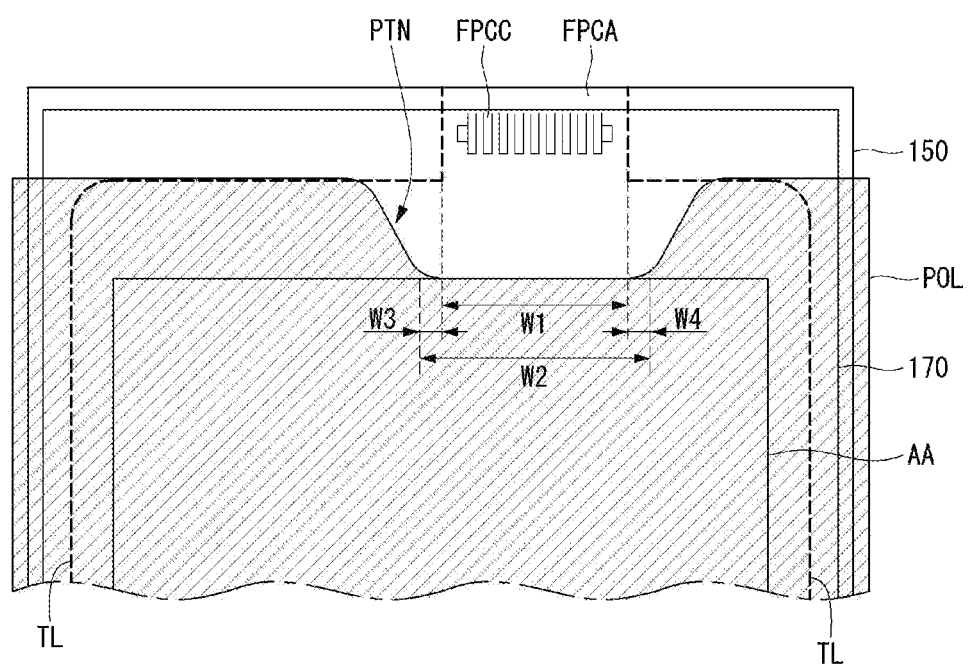

FIGS. 14A and 14B illustrate a method for trimming a display panel according to a third aspect of the disclosure.

As shown in FIGS. 14A and 14B, a polarizer POL is attached to a touch screen 170 and covers a display area AA and a non-display area around the display area AA. The polarizer POL exposes a connection area FPCA where a connector FPCC exists and a periphery of the connector FPCC. A display panel 150 and the touch screen 170 have almost the same size.

However, the polarizer POL is provided smaller than the display panel 150 and the touch screen 170, in order to expose the connection area FPCA in which the connector FPCC is formed and the periphery of the connector FPCC.

As a result, an upper end of the polarizer POL exists between the display area AA and the connector FPCC.

The third aspect of the disclosure uses the polarizer POL of a quadrilateral or rectangular shape having a pattern PTN formed by cutting a portion of the polarizer POL corresponding to the connector FPCC (or the periphery of the connector FPCC). The pattern PTN is configured such that a portion adjacent to the connector FPCC is removed more than a portion adjacent to the display area AA. For example, the pattern PTN has a trapezoidal shape by cutting a portion corresponding to the connector FPCC, so that the portion corresponding to the connector FPCC is recessed inside the polarizer POL. Namely, the third aspect of the disclosure uses the free form polarizer POL.

Because the polarizer POL according to the third aspect of the disclosure includes the pattern PTN recessed inside the polarizer POL, an upper end of the polarizer POL can coincide with a trimming line TL without considering heat applied to the connector FPCC. Namely, the third aspect of the disclosure does not provide a separation distance between the trimming line TL and the upper end of the polarizer POL.

As a result, a distance (or referred to as "U-shaped bezel") between the trimming line TL and the upper end of the display area AA and a distance (or referred to as "F-shaped bezel") between an outer end of the connector FPCC and the upper end of the display area AA can decrease. Namely, even when the upper end of the polarizer POL coincides with the trimming line TL in the third aspect of the disclosure, both the U-shaped bezel and the F-shaped bezel do not increase compared to the experimental examples.

Because the third aspect of the disclosure attaches the free form polarizer POL to the touch screen 170 and then performs a trimming process, the third aspect of the disclosure can perform the trimming process without increasing a distance related to the bezel and without being affected by the optical characteristics of the polarizer POL.

An inner width W2 of the pattern PTN may be greater than a width W1 occupied by the connector FPCC in consideration of an adhesive margin of the polarizer POL and heat applied to the connector FPCC. For example, because the pattern PTN has margin widths W3 and W4 so that portions corresponding to left and right trimming lines TL of the connector FPCC are wider than the connector FPCC, the inner width W2 of the pattern PTN may be greater than the width W1 occupied by the connector FPCC. However, the aspect is not limited thereto. Further, as shown in FIGS. 14A and 14B, edges of the pattern PTN may be straight or curved.

Fourth Aspect

Figure 15A:
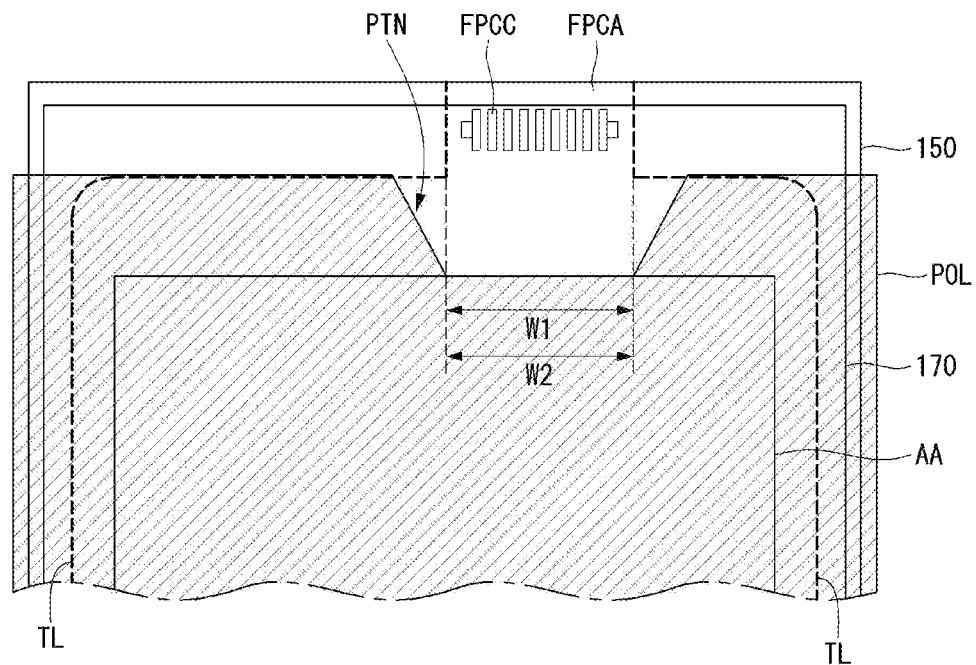
FIGS. 15A and 15B illustrate a method for trimming a display panel according to a fourth aspect of the disclosure.
Figure 15B:
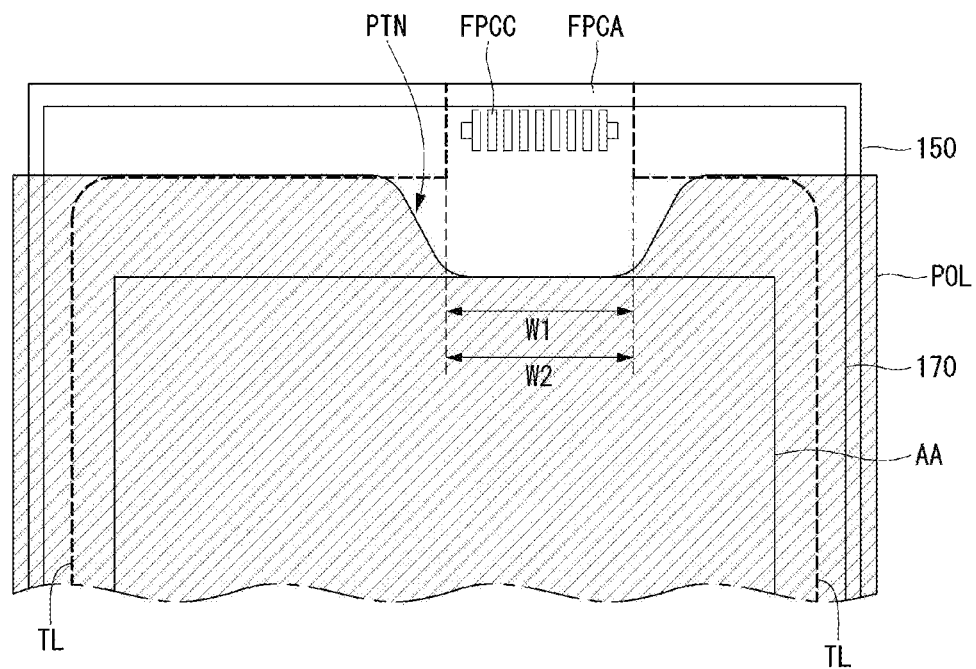

FIGS. 15A and 15B illustrate a method for trimming a display panel according to a fourth aspect of the disclosure.

As shown in FIGS. 15A and 15B, a polarizer POL is attached to a touch screen 170 and covers a display area AA and a non-display area around the display area AA. The polarizer POL exposes a connection area FPCA where a connector FPCC exists and a periphery of the connector FPCC. A display panel 150 and the touch screen 170 have almost the same size.

However, the polarizer POL is provided smaller than the display panel 150 and the touch screen 170, in order to expose the connection area FPCA in which the connector FPCC is formed and the periphery of the connector FPCC. As a result, an upper end of the polarizer POL exists between the display area AA and the connector FPCC.

The fourth aspect of the disclosure uses the polarizer POL of a quadrilateral or rectangular shape having a pattern PTN formed by cutting a portion of the polarizer POL corresponding to the connector FPCC (or the periphery of the connector FPCC). The pattern PTN is configured such that a portion adjacent to the connector FPCC is removed more than a portion adjacent to the display area AA. For example, the pattern PTN has a trapezoidal shape by cutting a portion corresponding to the connector FPCC, so that the portion corresponding to the connector FPCC is recessed inside the polarizer POL. Namely, the fourth aspect of the disclosure uses the free form polarizer POL.

Because the polarizer POL according to the fourth aspect of the disclosure includes the pattern PTN recessed inside the polarizer POL, an upper end of the polarizer POL can coincide with a trimming line TL without considering heat applied to the connector FPCC. Namely, the fourth aspect of the disclosure does not provide a separation distance between the trimming line TL and the upper end of the polarizer POL.

As a result, a distance (or referred to as "U-shaped bezel") between the trimming line TL and the upper end of the display area AA and a distance (or referred to as "F-shaped bezel") between an outer end of the connector FPCC and the upper end of the display area AA can decrease. Namely, even when the upper end of the polarizer POL coincides with the trimming line TL in the fourth aspect of the disclosure, both the U-shaped bezel and the F-shaped bezel do not increase compared to the experimental examples.

Because the fourth aspect of the disclosure attaches the free form polarizer POL to the touch screen 170 and then performs a trimming process, the fourth aspect of the disclosure can perform the trimming process without increasing a distance related to the bezel and without being affected by the optical characteristics of the polarizer POL.

An inner width W2 of the pattern PTN may be the same as a width W1 occupied by the connector FPCC in consideration of an adhesive margin of the polarizer POL and heat applied to the connector FPCC. Even when the inner width W2 of the pattern PTN is the same as the width W1 occupied by the connector FPCC, an outer width of the pattern PTN is greater than the width W1 occupied by the connector FPCC. Thus, an influence of heat applied to the connector FPCC is small. Further, as shown in (a) and (b) of FIG. 15, edges of the pattern PTN may be straight or curved.

As described above, the aspects of the disclosure can provide the polarizer capable of facilitating the manufacture of the display panel of a desired shape while decreasing the bezels of the display panel and the touch screen. Furthermore, the aspects of the disclosure can provide the display device and the method of manufacturing the same capable of implementing the display panel at a desired shape using the free form polarizer selected in consideration of the physical characteristics and the optical characteristics.

Although the aspects have been described with reference to a number of illustrative aspects thereof, numerous other modifications and aspects may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel having a display area;
a touch screen positioned on the display panel;
a connector protruding from one side of the touch screen and connected to an external device; and
a polarizer positioned on the touch screen, the polarizer including a recessed pattern having first, second and third segments adjacent to the connector and overlapping the display area so that the portion is recessed inside the polarizer,
wherein the connector includes a pad having a plurality of electrodes,
wherein the first segment is parallel to a side of the polarizer facing the connector, the second segment has a first slope inclined with the first segment and the third segment has a second slope inclined with respect to the first portion,
wherein the side of the polarizer facing the connector is aligned with a side of the display panel where the connector is located except for the recessed pattern, and
wherein the first segment is greater than each of the second and third segments, and
wherein a portion of the recessed pattern adjacent to the connector has a width greater than a width of a portion of the recessed pattern that is aligned with an edge of the display area to provide an adhesive margin, avoid heat damage and minimize a bezel size of the display panel,
wherein a portion of the polarizer extended beyond the display area has a same thickness as a portion of the polarizer covering the display area,
wherein the first slope of the second segment is corresponding to the second slope of the third segment, and
wherein the polarizer and the display panel are aligned without being spaced apart in the edges.

2. The display device of claim 1, wherein the recessed pattern has a rectangular shape, a trapezoidal shape, or a polygonal shape.

3. The display device of claim 1, wherein the recessed pattern has a straight or curved edge.

4. A method of manufacturing a display device comprising:
manufacturing a display panel having a display area and a touch screen having a connector;
positioning the touch screen on the display panel;
defining a trimming line on the display panel and the touch screen;
positioning a polarizer exposing the connector on the touch screen; and
trimming along the trimming line,
wherein the polarizer includes a recessed pattern having first, second and third segments adjacent to the connector and the display area so that the portion is recessed inside the polarizer,
wherein the connector includes a pad having a plurality of electrodes, and
wherein the first segment is parallel to a side of the polarizer facing the connector, the second segment has a first slope inclined with the first segment and the third segment has a second slope inclined with respect to the first portion,
wherein the side of the polarizer facing the connector is aligned with a side of the display panel where the connector is located except for the recessed pattern,
wherein the first segment is greater than each of the second and third segments, and
wherein a portion of the recessed pattern adjacent to the connector has a width greater than a width of a portion of the recessed pattern that is aligned with an edge of the display area to provide an adhesive margin, avoid heat damage and minimize a bezel size of the display panel,
wherein a portion of the polarizer extended beyond the display area has a same thickness as a portion of the polarizer covering the display area,
wherein the first slope of the second segment is corresponding to the second slope of the third segment, and
wherein the polarizer and the display panel are aligned without being spaced apart in the edges.

5. The method of claim 4, wherein the trimming along the trimming line comprises trimming the display panel and the touch screen so that the connector protrudes from one side of the touch screen and edges of the display panel and the touch screen are curved.

6. The method of claim 4, wherein the recessed pattern has a straight or curved edge.

7. A display device comprising:
a display panel having a display area;
a connector protruding from the display area and to be connected with an external device; and
a polarizer disposed over the display panel and having a recessed pattern having first, second and third segments and facing the connector and overlapping the display area, the polarizer having an uppermost portion in line with a trimming line,
wherein the connector includes a pad having a plurality of electrodes, and
wherein the first segment is parallel to a side of the polarizer facing the connector, the second segment has a first slope inclined with the first segment and the third segment has a second slope inclined with respect to the first portion,
wherein the side of the polarizer facing the connector is aligned with a side of the display panel where the connector is located except for the recessed pattern, and
wherein the first segment is greater than each of the second and third segments,
wherein a portion of the recessed pattern adjacent to the connector has a width greater than a width of a portion of the recessed pattern that is aligned with an edge of the display area to provide an adhesive margin, avoid heat damage and minimize a bezel size of the display panel,
wherein a portion of the polarizer extended beyond the display area has a same thickness as a portion of the polarizer covering the display area,
wherein the first slope of the second segment is corresponding to the second slope of the third segment, and
wherein the polarizer and the display panel are aligned without being spaced apart in the edges.

8. The polarizer of claim 7, wherein the recessed pattern has an inner width corresponding to a length of the first segment and an outer width corresponding to a separation distance between the second segment and the third segment.

9. The polarizer of claim 8, wherein the outer width of the recessed pattern is greater than the inner width of the recessed pattern.

10. The polarizer of claim 7, wherein the recessed pattern has a straight edge or a curved edge.

* * * * *